(12) United States Patent
Sato et al.

(10) Patent No.: US 7,169,648 B2
(45) Date of Patent: Jan. 30, 2007

(54) PROCESS FOR PRODUCING A SEMICONDUCTOR DEVICE

(75) Inventors: Akinori Sato, Saitama (JP); Osamu Yamazaki, Saitama (JP); Hideo Senoo, Saitama (JP); Takashi Sugino, Phoenix, AZ (US)

(73) Assignee: Lintec Corporation, Tokyo (JP)

( * ) Notice: Subject to any disclaimer, the term of this patent is extended or adjusted under 35 U.S.C. 154(b) by 76 days.

(21) Appl. No.: 10/916,177

(22) Filed: Aug. 11, 2004

(65) Prior Publication Data

US 2005/0037542 A1 Feb. 17, 2005

(30) Foreign Application Priority Data

Aug. 12, 2003 (JP) .............................. 2003-292320

(51) Int. Cl.
*H01L 21/00* (2006.01)

(52) U.S. Cl. ...................... 438/118; 438/113; 438/114; 438/464; 438/465

(58) Field of Classification Search ................ 438/118, 438/119, 113, 114, 464, 465; 257/684, 666
See application file for complete search history.

(56) References Cited

U.S. PATENT DOCUMENTS 6,972,249 B2* 12/2005 Akram et al. ................ 438/613

2001/0014492 A1* 8/2001 Noguchi et al. ............. 438/118
2001/0036711 A1* 11/2001 Urushima .................... 438/460
2005/0009241 A1* 1/2005 Nakata et al. ............... 438/126

FOREIGN PATENT DOCUMENTS

JP 2001-144140 A 5/2001

* cited by examiner

*Primary Examiner*—Michael Trinh
*Assistant Examiner*—Seth Barnes
(74) *Attorney, Agent, or Firm*—The Webb Law Firm

(57) ABSTRACT

A process for producing a resin-sealed semiconductor device having high reliability which is produced more easily and efficiently without voids, the process comprising the steps of: (a) providing a semiconductor wafer having circuits on a surface; (b) applying a resin sheet composed of a support and an adhesive resin layer releasable from the support, on the circuit surface of the semiconductor wafer, and fixing an outer periphery of the resin sheet with a ring frame; (c) cutting the semiconductor wafer and the resin layer by each circuit to form chips; (d) picking up each chip together with the resin layer from the support; (e) mounting each chip on a predetermined position of a chip mounting substrate through the resin layer; and (f) firmly bonding the chip on the chip mounting substrate so as to achieve conduction between the chip and the chip mounting substrate.

2 Claims, 2 Drawing Sheets

PROCESS FOR PRODUCING A SEMICONDUCTOR DEVICE

BACKGROUND OF THE INVENTION

1. Field of the Invention

The present invention relates to a process for producing a semiconductor device, and more particularly to a process whereby a resin-sealed semiconductor device having high reliability can be efficiently produced without voids.

2. Brief Description of the Prior Art

It is common practice to seal a semiconductor device with a resin to protect a circuit surface. Such resin-sealed semiconductor devices are generally manufactured by mounting individual IC chips on respective chip mounting substrates and sealing each chip with a resin using a mold.

More specifically, currently employed methods are:

(1) IC chip is connected with a chip mounting substrate through a gold wire or the like, and is sealed with a resin.

(2) IC chip is mounted on a chip mounting substrate having conductive protrusions and is connected with the substrate via the conduction protrusions, and is thereafter sealed with a resin.

(3) IC chip is connected with a chip mounting substrate through an anisotropic conductive film or paste, and is thereafter sealed with a resin.

In the method (1) given above, the sealing resin has to be molded in a size enough to encapsulate the gold wire as well, and consequently the semiconductor device has a size far larger than the chip size. Therefore, this method is unsuitable for small apparatuses such as cellular phones. Accordingly, the methods (2) and (3) are more used because they can produce semiconductor devices as small as the chip size.

However, the method (2) causes spacing between the IC chip and the chip mounting substrate by the height of the conductive protrusions. The sealing resin cannot fill the spacing adequately and voids often result. Accordingly, prior to the resin sealing, an insulating resin (underfill resin) must be filled between the IC chip and the chip mounting substrate.

The method (3) requires troublesome work in applying an anisotropic conductive film or paste to a small IC chip. Particularly, it is difficult to apply the anisotropic conductive paste in a constant amount. When the paste is used in amounts differing in each application, device properties could be nonuniform.

To solve such problems, JP-A-2001-144140 discloses a method for producing a semiconductor device comprising providing a semiconductor wafer having circuits on a surface, forming an adhesive thin layer on the circuit surface of the semiconductor wafer, cutting the semiconductor wafer into chips by each circuit, mounting each chip on a predetermined position of a chip mounting substrate through the adhesive thin layer, and firmly bonding the chip on the chip mounting substrate so as to form conduction between the chip and the chip mounting substrate.

The method described above produces chips by dicing a semiconductor wafer that has an adhesive thin layer on its circuit surface. Because the chips obtained have the adhesive thin layer adhered on the circuit surface thereof, voids can be prevented in the resin sealing and products having high uniformity and reliability may be obtained.

However, this method requires application of a dicing tape to the back of the semiconductor wafer in order to fix the wafer during cutting into chips (Paragraph [0030] of JP-A-2001-144140).

The present invention has been made in view of the background art as described above. Therefore, it is an object of the invention to provide a process whereby a resin-sealed semiconductor device having high reliability may be produced more easily and efficiently without formation of voids in mold resin.

SUMMARY OF THE INVENTION

A process for producing a semiconductor device according to the present invention comprises:

providing a semiconductor wafer having circuits on a surface;

applying a resin sheet composed of a support and an adhesive resin layer releasable from the support, on the circuit surface of the semiconductor wafer and fixing an outer periphery of the resin sheet with a ring frame;

cutting the semiconductor wafer and the resin layer by each circuit to form chips;

picking up each chip together with the resin layer from the support;

mounting each chip on a predetermined position of a chip mounting substrate through the resin layer; and firmly bonding the chip on the chip mounting substrate so as to achieve conduction between the chip and the chip mounting substrate.

In another embodiment of the process according to the present invention, the resin layer of the resin sheet is made of an insulating hardenable pressure-sensitive adhesive (hereinafter simply referred to as "hardenable PSA"), the chip circuit and/or the chip mounting substrate have conduction protrusions formed thereon, and the process comprises heating or pressing the resin layer and thereby fluidizing the same so as to achieve conduction between the chip and the chip mounting substrate through the conductive protrusions, and hardening the resin layer.

The present invention enables simplified and efficient production of a resin-sealed semiconductor device having high reliability while preventing formation of voids. The invention provides cost advantages and allows reduction of troubles in the semiconductor device production, by employing a resin sheet in order to form a void-free resin layer on a circuit surface of semiconductor wafer and chips, and utilizing the resin sheet as a dicing sheet in the wafer dicing and the resin layer as an adhesive in the die bonding.

DETAILED DESCRIPTION OF THE INVENTION

Hereinbelow, the present invention will be described in greater detail with reference to the drawings.

Figure 1:
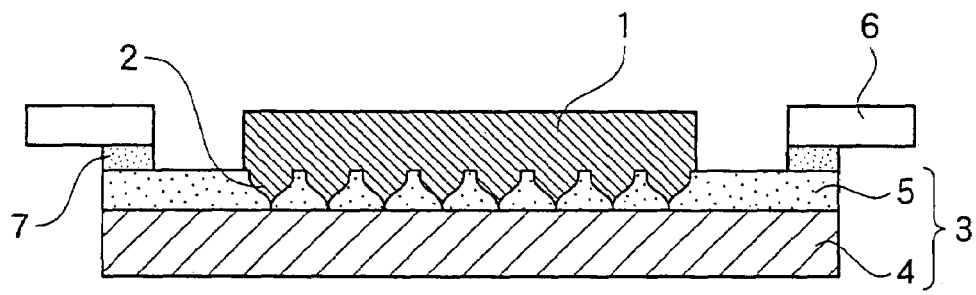
FIGS. 1 to 4 show steps in the process for producing a semiconductor device according to the present invention.

The process for producing a semiconductor device according to the present invention is initiated, as illustrated in FIG. 1, by providing a semiconductor wafer 1 having circuits on a surface and applying a resin sheet 3 on the circuit surface of the semiconductor wafer 1.

Conventional silicon semiconductor wafers and gallium arsenide semiconductor wafers are suitable as the semiconductor wafer 1. However, the examples are not limited thereto and include various kinds of other semiconductor wafers. The circuits on the wafer surface may be formed in desired configuration by the common techniques, including etching and lift-off process. Preferably, the circuit surface has conductive protrusions 2 for securing conduction with a chip mounting substrate. The conductive protrusions 2 may have various heights and diameters depending on the semiconductor device design, but are generally about 10 to 100 μm in height and about 20 to 100 μm in diameter. The conductive protrusions 2 are typically formed from metals such as gold, copper and solder.

The resin sheet 3 is composed of a support 4 and a resin layer 5 formed thereon. The resin sheet 3 may have any forms, including tapes and labels.

The support 4 and resin layer 5 will be described below.

The support 4 of the resin sheet 3 may be a transparent film. Examples thereof include polyethylene films, polypropylene films, polybutene films, polybutadiene films, polymethylpentene films, polyvinylchloride films, vinyl chloride copolymer films, polyethylene terephthalate films, polyethylene naphthalate films, polybutylene terephthalate films, polyurethane films, ethylene vinyl acetate copolymer films, ionomer resin films, ethylene/(meth)acrylic acid copolymer films, ethylene/(meth)acrylate copolymer films, polystyrene films, polycarbonate films, polyimide films, and crosslinked films and laminated films of these films. Further, colored (untransparent) films of the above transparent films, and fluororesin films are also available.

In the production process of a semiconductor device according to the present invention, IC chips are picked up from the support 4 while allowing the resin layer 5 to remain adhered to the circuit surface. Therefore, the surface of the support 4 that contacts with the resin layer 5 preferably has a surface tension of 40 mN/m or less, more preferably 37 mN/m or less, and particularly preferably 35 mN/m or less. Such low surface tension of the support can be obtained by appropriately selecting the support material or by release coating the support surface with a release agent such as a silicone resin or an alkyd resin.

The support 4 generally has a thickness of about 10 to 500 μm, preferably about 15 to 300 μm, and particularly preferably about 20 to 250 μm.

In the production process according to the present invention, the resin layer 5 has a function as a sealing resin on the circuit surface of wafer and chips, is used for securely fixing the wafer in the wafer dicing, remains adhered to the circuit surface of each chip picked up, fills the spacing between the chip and the chip mounting substrate in the chip mounting, and is used to bond the chip and the mounting substrate.

The resins available in the resin layer include hardenable PSA and thermoplastic resins. In the step of applying the resin sheet to the circuit surface of the semiconductor wafer, the resin is heated and/or pressed to attain certain fluidity and to precisely follow the unevenness of the circuit surface. As a result, a resin layer free from voids may be formed after the resin sealing.

The hardenable PSA used in the resin sheet is an adhesive that has pressure sensitivity at ordinary temperatures and is hardened by heat to become nonfluid and to firmly bond with the adherend. Examples of the hardenable PSA include mixtures of a binder resin having pressure sensitivity at ordinary temperatures and a thermosetting resin.

Exemplary binder resins having pressure sensitivity at ordinary temperatures include acrylic resins, polyester resins, polyvinyl ethers, urethane resins and polyamide resins. Exemplary thermosetting resins include epoxy resins, acrylic resins, polyimide resins, phenolic resins, urea resins, melamine resins and resorcinol resins, with the epoxy resins being preferred. The hardenable PSA is preferably incorporated with a UV ray curing resin to control releasability from the support 4. The UV ray curing resins include polyfunctional monomers such as dipentaerythritol hexaacrylate, and urethane-type acrylate oligomers. The hardenable PSA layer incorporated with the UV ray curing resin can exhibit good adhesion with the support 4 before UV irradiation and can be easily separated from the support 4 after UV irradiation.

The hardenable PSA comprising the aforesaid components allows application at ordinary temperatures and displays appropriate fluidity upon heating and pressing so that it can precisely follow the unevenness of the circuit surface to prevent voids in the resultant resin layer. Furthermore, the hardenable PSA has both energy ray curing properties and thermosetting properties. Therefore, the hardenable PSA layer can contribute to fixing the wafer in the dicing by adhering to the support 4 and can be used as an adhesive in the mounting to bond the chip with the chip mounting substrate. Moreover, thermosetting the hardenable PSA layer results in a cured product having high impact resistance. Furthermore, the cured product is excellent in balance between shear strength and peeling strength, and can maintain sufficient bonding properties even under severe hot and humid conditions.

The thermoplastic resin used in the resin sheet 3 is a resin that provides adhesion by being plasticized with heat. For example, thermoplastic resins having chemical and physical heat resistance such as polyimide resins are preferred since use thereof leads to enhancement in reliability of the semiconductor devices.

Before use of the resin sheet 3, the exposed resin surface thereof may be covered with a release film to protect the resin layer 5.

The outer periphery of the resin layer 5 may be provided with a pressure-sensitive adhesive sheet 7 for fixing a ring frame 6.

The hardenable PSA layer or the thermoplastic resin layer is generally insulative. However, the resin layer 5 may be an anisotropic conductive layer. The anisotropic conductive adhesive used herein is an adhesive that contains conductive particles 11 and forms a resin layer in which the conductive particles 11 are apart from each other before the layer is compressed and are brought into contact with each other only in the direction of thickness of the resin layer when the chip is compression bonded to the chip mounting substrate through the resin layer, thereby achieving anisotropic conductivity. Specifically, the contact between the conductive particles 11 is brought about as a result of compression of the resin layer by the conductive protrusion electrodes.

The resin layer 5 comprising the above components desirably has thickness ranging from 3 to 100 μm, and preferably from 10 to 60 μm.

In the process for producing a semiconductor device according to the present invention, the resin sheet 3 is applied to the circuit surface of the semiconductor wafer 1 at ordinary temperatures or temperatures lower than the hardening condition of the resin (hardenable PSA).

The circuit surface has the conductive protrusions (bumps) 2 or the like. When such circuit surface is sealed by injection of a liquid resin, the air in the vicinity of the irregularities in the encapsulated environment is unlikely to be removed and voids often result. Meanwhile, in the present invention, the resin sheet is applied to the circuit surface while observing and controlling the surface state, so that a void-free resin layer can be easily formed.

Subsequently, when the resin layer 5 contains the energy ray curing component, energy rays are applied thereto through the support 4. The irradiation increases the cohesion of the resin layer 5, so that the adhesion between the resin layer 5 and the support 4 is lowered.

The resin sheet 3 functions to securely fix the semiconductor wafer 1 and is also used as a dicing tape.

Figure 2:
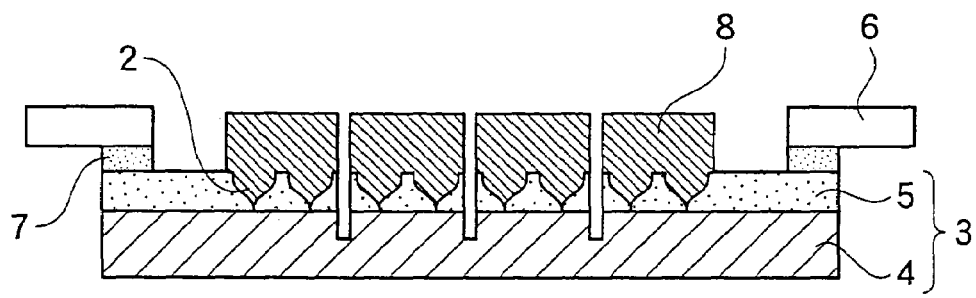

That is, the resin sheet 3 is applied to the circuit surface of the semiconductor wafer 1 and the outer periphery of the resin sheet 3 is fixed with the ring frame 6 (FIG. 1); and the semiconductor wafer 1 and the resin layer 5 are cut by each circuit to form chips 8 (FIG. 2).

Because the circuit surface is covered with the resin sheet, the dicing line is confirmed by means of an infrared camera or the like through the back surface.

The cutting of the semiconductor wafer 1 and the resin layer 5 is performed using cutting means such as a dicing saw. The cutting depth is determined in consideration of the thickness of the wafer 1 and resin layer 5, and abrasion of the dicing saw.

The irradiation of energy rays may be performed after the dicing, or even after the expanding step-described below.

Thereafter, the chips 8 together with the resin layer 5 are picked up from the support 4. Where necessary, the resin sheet may be expanded prior to the picking up to widen the distances between the IC chips. The chips 8 are then each mounted on a predetermined position on the chip mounting substrate 9 through the resin layer 5.

Figure 3:
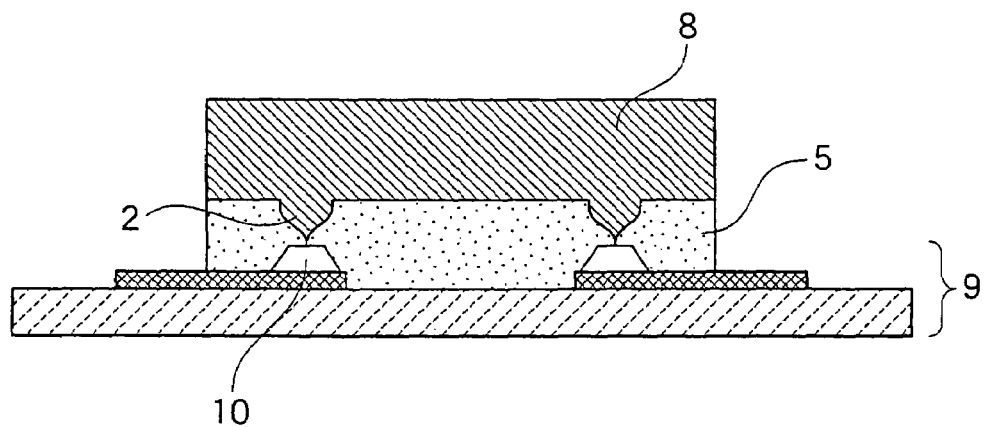

Subsequently, each chip 8 is firmly bonded to the chip mounting substrate 9 so as to secure conduction between the chip 8 and the chip mounting substrate 9, thereby producing a semiconductor device.

Where the resin layer 5 is insulative and exhibits fluidity at high temperatures like the thermoplastic resin, the chip 8 having conductive protrusions 2 on the circuit or the chip mounting substrate 9 having conductive protrusions. 10 is used. These two conductive protrusions 2 and 10 may be used in combination. FIG. 3 illustrates an embodiment which employs the chip 8 having the conductive protrusions 2 and the chip mounting substrate 9 having the conductive protrusions 10.

Figure 4:
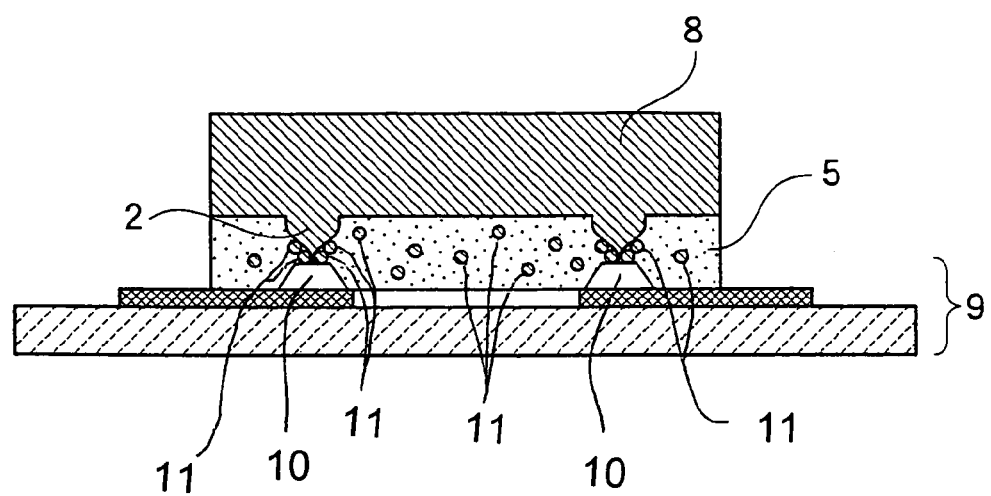

In the illustrated embodiment, the chip 8 wherein the insulating resin layer 5 has been transferred to the circuit surface is mounted, via the insulating resin layer 5, on the chip mounting substrate 9 having the conductive protrusions 10. At this stage, electrical conduction has not been formed yet between the chip 8 and the chip mounting substrate 9. Therefore, the insulating resin layer 5 is heated to become fluidized and is pressed to contact the conductive protrusions 2 and 10, thereby achieving conduction. Subsequently, the insulating resin layer 5 is cooled to ordinary temperatures to bond the chip 8 to the chip mounting substrate 9.

Where the insulating resin layer 5 has thermosetting properties like the hardenable PSA, the chip 8 is bonded in a manner such that the chip 8 is mounted on the chip mounting substrate 9 via the insulating resin layer 5, the insulating resin layer 5 is heated and fluidized while avoiding hardening, the conductive protrusions 2 and 10 are contacted together to achieve electrical conduction between the chip 8 and the chip mounting substrate 9, and the insulating resin layer 5 is heated at or above its hardening temperature.

Where the resin layer 5 is made of the anisotropic conductive adhesive with conductive particles 11 (FIG. 4), the chip 8 is mounted on and bonded to the chip mounting substrate 9 so as to achieve conductivity in the direction of thickness of the anisotropic conductive resin layer 5. In this case, either or both of the chip 8 and the chip mounting substrate 9 may have the conductive protrusions. FIG. 4 illustrates an embodiment which employs the chip 8 having the conductive protrusions 2 and the chip mounting substrate 9 having the conductive protrusions 10.

Heating and press bonding conditions may vary depending on the chip design and the kind and characteristics of the resin layer, but are generally such that the heating temperature is about 100 to 220° C. and the pressure is about 5 to 500 N/cm$^2$.

In bonding the chip 8 to the chip mounting substrate 9, a flip chip bonder or the like may be used. The flip chip bonder capable of precision setting of the heating and pressing conditions is preferred.

According to the production process of a semiconductor device described hereinabove, the chip 8 can be tightly bonded to the chip mounting substrate 9 without voids so that a highly reliable void-free semiconductor device can be obtained even if resin sealing is performed.

According to the present invention, a resin-sealed semiconductor device having high reliability may be produced more simply and efficiently without voids. The invention provides cost advantages and enables reduction of troubles in the semiconductor device production, by employing a resin sheet in order to form a void-free resin layer on a circuit surface of semiconductor wafer and chips, and utilizing the resin sheet as a dicing sheet in the wafer dicing and the resin layer as an adhesive in the die bonding.

EXAMPLE

Hereinbelow, the present invention will be described in detail by the following Example. However, it should be construed that the invention is in no way limited to the Example.

Example 1

A hardenable PSA composition was prepared from:

20 parts by weight of an acrylic resin as a binder resin (copolymer comprising 50 parts by weight of butyl acrylate, 10 parts by weight of methyl methacrylate, 20 parts by weight of glycidyl methacrylate and 20 parts by weight of 2-hydroxyethyl acrylate, weight-average molecular weight: 850,000, glass transition temperature: −26° C.)

10 parts by weight of dipentaerythritol hexaacrylate as an energy ray polymerizable compound (molecular weight: 578);

0.3 part by weight of α-hydroxycyclohexyl phenyl ketone as a photopolymerization initiator;

epoxy resins consisting of 25 parts by weight of a liquid bisphenol A epoxy resin (epoxy equivalent: 190), 35 parts by weight of a solid bisphenol A epoxy resin (epoxy equivalent: 850), and 20 parts by weight of a solid o-cresol novolak epoxy resin (epoxy equivalent: 190); and latent heat activatable epoxy resin-curing agents consisting of 2 parts by weight of dicyandiamide, 2 parts by weight of 2-phenyl-4,5-hydroxymethyl imidazole, and 0.5 part by weight of aromatic polyisocyanate.

The hardenable PSA composition was applied on a polyethylene film (100 μm thick) as a support having a surface tension of 35 mN/m, and dried. Thus, a resin sheet was obtained that had a 50 μm thick insulating hardenable PSA layer.

Subsequently, a semiconductor wafer (diameter: 6 inch, thickness: 300 μm, bump diameter: 75 μm, bump height: 5 μm) having circuit patterns was provided. The hardenable PSA layer was compression bonded to the circuit surface of the semiconductor wafer at ordinary temperatures using a tape mounter (Adwill RAD 2500 m/6 available from LIN- TEC CORPORATION) The resin sheet was then UV irradiated through the support by means of a UV irradiation apparatus (Adwill RAD 2000 m/6 available from LINTEC CORPORATION).

Thereafter, the wafer back was marked along the dicing line on the circuit surface, and the wafer was cut along the marked line by each circuit pattern by use of a dicing machine (DFG-2H/6T available from DISCO CORPORATION) to produce chips. Subsequently, the chips were picked up such that the hardenable PSA layer remain adhered on the circuit surface of the chip. The chips picked up were collected on a chip tray.

The chips were then each mounted on an evaluation substrate by means of a flip chip bonder (FB30T-M available from Kyusyu Matsushita Electric Industrial Co., Ltd.) under the conditions of a stage temperature of 60° C., a head temperature of 130° C., a load of 20 N, and a time of 60 sec.

After the mounting, the chip and the substrate were maintained in a 150° C. oven for 60 min to completely harden the hardenable PSA layer. Thus, a semiconductor device was produced. Resistivity was measured between terminals of the semiconductor device using a resistivity meter (Loresta-GP MCP-T600, available from Mitsubishi Chemical Corporation) to confirm conduction between the terminals to be conducted and insulation between the terminals to be insulated.

What is claimed is:

1. A process for producing a semiconductor device comprising:

providing a semiconductor wafer having circuits on a surface;

applying a resin sheet composed of a support and an adhesive resin layer releasable from the support, on the circuit surface of the semiconductor wafer, and fixing an outer periphery of the resin sheet with a ring frame;

cutting the semiconductor wafer and the resin layer by each circuit to form chips;

picking up each chip together with the resin layer from the support;

mounting each chip on a predetermined position of a chip mounting substrate through the resin layer; and firmly bonding the chip on the chip mounting substrate so as to achieve conduction between the chip and the chip mounting substrate.

2. The process for producing a semiconductor device according to claim 1, wherein the resin layer of the resin sheet is made of an insulating hardenable pressure-sensitive adhesive, the chip circuit and/or the chip mounting substrate have conductive protrusions formed thereon, and the process comprises heating and/or pressing the resin layer and thereby fluidizing the same so as to achieve conduction between the chip and the chip mounting substrate through the conductive protrusions, and hardening the resin layer.

* * * * *